(12) United States Patent
Kakehi et al.

(10) Patent No.: US 11,658,002 B2
(45) Date of Patent: May 23, 2023

(54) CHARGED PARTICLE BEAM ADJUSTMENT METHOD, CHARGED PARTICLE BEAM DRAWING METHOD, AND CHARGED PARTICLE BEAM IRRADIATION APPARATUS

(71) Applicant: NUFLARE TECHNOLOGY, INC., Yokohama (JP)

(72) Inventors: Ryoichi Kakehi, Yokohama (JP); Takahito Nakayama, Chigasaki (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 84 days.

(21) Appl. No.: 17/463,967

(22) Filed: Sep. 1, 2021

(65) Prior Publication Data

US 2022/0068591 A1   Mar. 3, 2022

(30) Foreign Application Priority Data

Sep. 3, 2020   (JP) .............................. JP2020-148499

(51) Int. Cl.
   *H01J 37/21*   (2006.01)
   *H01J 37/28*   (2006.01)
   (Continued)

(52) U.S. Cl.
   CPC .............. *H01J 37/21* (2013.01); *H01J 37/10* (2013.01); *H01J 37/1471* (2013.01); *H01J 37/28* (2013.01); *H01J 2237/0435* (2013.01)

(58) Field of Classification Search
   CPC .. H01J 37/00; H01J 37/02; H01J 37/26; H01J 37/28; H01J 37/21; H01J 37/10;
   (Continued)

(56) References Cited

U.S. PATENT DOCUMENTS

| 6,252,344 B1 | 6/2001 | Ooae et al. | |
| 2009/0314950 A1* | 12/2009 | Iizuka | H01J 37/3174 250/397 |
| 2011/0095182 A1* | 4/2011 | Terada | H01J 37/05 250/311 |

FOREIGN PATENT DOCUMENTS

| JP | 61-294750 A | 12/1986 |
| JP | 8-28207 B2 | 3/1996 |

(Continued)

*Primary Examiner* — Jason L McCormack
(74) *Attorney, Agent, or Firm* — Oblon, McClelland, Maier & Neustadt, L.L.P.

(57) ABSTRACT

A charged particle beam adjustment method includes scanning, with a charged particle beam an emission current of which is set to a first adjustment value smaller than a target value, an aperture substrate including a hole disposed to be a focus position of the charged particle beam using each of lens values in an electron lens and calculating first resolution, calculating a first function of lens values and the first resolution and calculating a lens value range, scanning, with the charged particle beam the emission current of which is set to a second adjustment value, the aperture substrate using each of lens values set to avoid the lens value range and calculating second resolution, calculating a second function of lens values and the second resolution and estimating a lens value at a just focus, and adjusting the electron lens to the lens value at the just focus.

7 Claims, 7 Drawing Sheets

(51) Int. Cl.
*H01J 37/147* (2006.01)
*H01J 37/10* (2006.01)

(58) Field of Classification Search
CPC ............... H01J 37/1471; H01J 37/3177; H01J 37/1472; H01J 37/3174; H01J 2237/0435; H01J 2237/1501; H01J 2237/216; G03F 7/2061
USPC ........................................ 250/306, 307, 310
See application file for complete search history.

(56) References Cited

FOREIGN PATENT DOCUMENTS

| | | | |
|---|---|---|---|
| JP | 11-224846 | A | 8/1999 |
| JP | 2000-11932 | A | 1/2000 |
| JP | 2007-49023 | A | 2/2007 |
| JP | 5905209 | B2 | 4/2016 |

* cited by examiner

CHARGED PARTICLE BEAM ADJUSTMENT METHOD, CHARGED PARTICLE BEAM DRAWING METHOD, AND CHARGED PARTICLE BEAM IRRADIATION APPARATUS

CROSS-REFERENCE TO RELATED APPLICATIONS

This application is based upon and claims the benefit of priority from Japanese Patent Application No. 2020-148499, filed on Sep. 3, 2020; the entire contents of which are incorporated herein by reference.

FIELD

The present invention relates to a charged particle beam adjustment method, a charged particle beam drawing method, and a charged particle beam irradiation apparatus.

BACKGROUND

A charged particle beam irradiation apparatus performs focus adjustment for adjusting a charged particle beam to a just focus of an electron lens and centering adjustment for causing the charged particle beam to pass through the center of an aperture. During such adjustment of the charged particle beam, the charged particle beam focused by the electron lens scans on an aperture substrate. At this time, the aperture substrate is sometimes heated and damaged by the charged particle beam.

Therefore, during the adjustment of the charged particle beam, an emission current (emission intensity) of the charged particle beam from an electron gun has been set to a value smaller than a target value and, after the adjustment, returned to the target value. In this case, after the emission current of the charged particle beam is returned to the target value, the adjustment in which the charged particle beam scans on the aperture substrate is not carried out.

However, the focus adjustment and the centering adjustment are sometimes necessary because of a drift of a cathode and a high-voltage power supply, a drift of an electron lens (a condenser lens), and the like generated after the emission current is set to the target value. In this case, in a state in which the emission current is set to the target value, the scan of the aperture substrate by the charged particle beam is repeated every time the adjustment is performed. The aperture substrate is heated. Therefore, electric charge is caused by contamination and a beam current becomes unstable. In some case, damage to the aperture substrate is accumulated and erosion occurs and the aperture substrate needs to be replaced.

DETAILED DESCRIPTION

Embodiments will now be explained with reference to the accompanying drawings. The present invention is not limited to the embodiments.

A charged particle beam adjustment method according to an embodiment of the present invention includes: scanning, with a charged particle beam an emission current of which is set to a first adjustment value smaller than a target value used for drawing, an aperture substrate including a hole disposed to be a position of a focus of the charged particle beam using each of a plurality of lens values in an electron lens provided on an upstream side of the aperture substrate and calculating first resolution at each of the plurality of lens values; calculating a first function of the plurality of lens value and the first resolution and calculating, from the first function, a lens value range obtained by adding a predetermined margin to a lens value at a just focus where resolution is minimized during actual drawing of the charged particle beam; scanning, with the charged particle beam the emission current of which is set to a second adjustment value larger than the first adjustment value and equal to or smaller than the target value, the aperture substrate using each of a plurality of lens values set to avoid the lens value range and calculating second resolution at each of the plurality of lens values; calculating a second function of the plurality of lens values and the second resolution and estimating a lens value at the just focus from the second function; and adjusting the electron lens to the estimated lens value at the just focus.

First Embodiment

Figure 1:
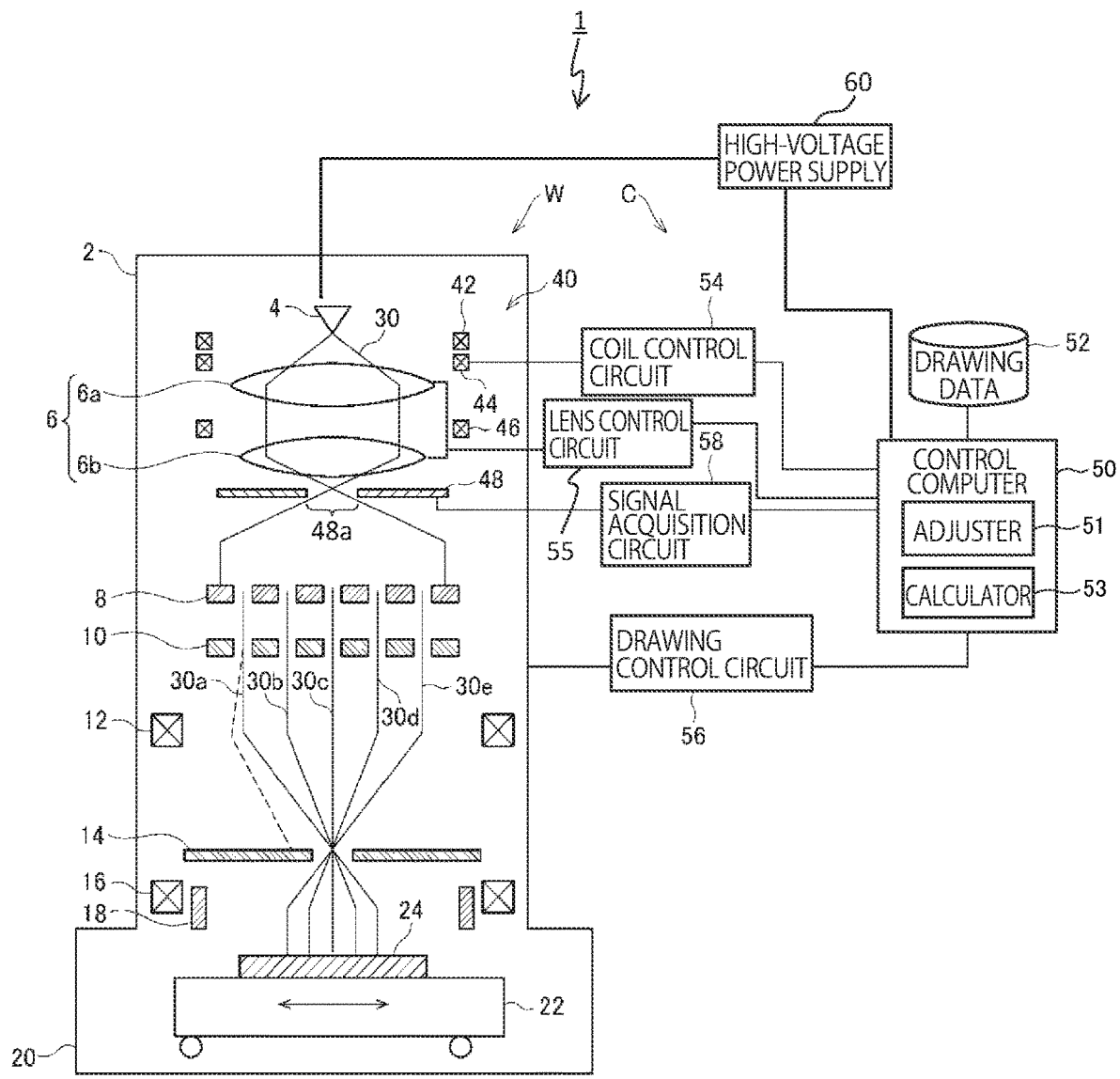
FIG. 1 is a schematic diagram of a charged particle beam irradiation apparatus according to a first embodiment.

FIG. 1 is a schematic diagram of a charged particle beam irradiation apparatus according to a first embodiment. In this embodiment, as an example of the charged particle beam irradiation apparatus, a configuration of a multi-charged particle beam drawing apparatus is explained.

However, the charged particle beam irradiation apparatus according to the present invention is not limited to the multi-charged particle beam drawing apparatus and may be, for example, a single charged particle beam drawing apparatus or a charged particle beam inspection apparatus. The charged particle beam is not limited to the electron beam and may be other charged particle beams such as an ion beam.

A charged particle beam irradiation apparatus 1 shown in FIG. 1 includes a drawing unit W that irradiates a drawing target substrate 24 with an electron beam and draws a desired pattern and a controller C that controls the operation of the drawing unit W.

The drawing unit W includes an electron beam lens barrel 2 and a drawing chamber 20. In the electron beam lens barrel 2, an electron gun (an emitter) 4, an illumination lens system 6, a molded aperture array substrate 8, a blanking aperture array substrate 10, a reduction lens 12, a limited aperture member 14, an objective lens 16, a deflector 18, and an alignment mechanism are disposed.

The illumination lens system 6 includes an electron lens 6a and an electron lens 6b. The electron lens 6b is disposed further on a rear side (a downstream side) than the electron lens 6a in a beam traveling direction of an electron beam 30 emitted from the electron gun 4.

The alignment mechanism 40 is provided between the electron gun 4 and the molded aperture array substrate 8 and includes alignment coils 42, 44, and 46 and an aperture substrate 48, in the center of which a circular aperture 48a is formed.

The alignment coil 42 adjusts an incident position of the electron beam 30 on the electron lens 6a. The alignment coil 44 adjusts an incident angle of the electron beam 30 on the aperture 48a. The alignment coil 46 adjusts an incident position of the electron beam 30 on the aperture 48a.

On the aperture substrate 48, a detector that detects an electron (a beam current) blocked by the aperture substrate 48 without passing through a hole in the center is provided.

In the drawing chamber 20, a stage 22 is disposed. On the stage 22, the drawing target substrate 24 is placed. The drawing target substrate 24 includes, for example, a wafer and a mask for exposure for transferring a pattern to the wafer using a reduction projection exposure apparatus or an extreme ultraviolet exposure apparatus (EUV) such as a stepper or a scanner including an excimer laser as a light source.

An optical axis of the electron beam 30 emitted from the electron gun 4 (the emitter) is adjusted by the alignment mechanism 40. The electron beam 30 passes through the aperture 48a and substantially perpendicularly illuminates the molded aperture array substrate 8. On the molded aperture array substrate 8, a plurality of holes (openings) are formed in a matrix shape at a predetermined array pitch. The holes are formed in, for example, a rectangular shape or a circular shape having the same dimension and shape.

The electron beam 30 illuminates the molded aperture array substrate 8 and parts of the electron beam 30 pass through the plurality of holes, whereby multiple beams 30a to 30e shown in FIG. 1 are formed.

In the blanking aperture array substrate 10, through holes are formed to match disposition positions of the holes of the molded aperture array substrate 8. Blankers formed by a pair of two electrodes are disposed in the through-holes. The multiple beams 30a to 30e passing through the through-holes are deflected independently from one another by voltages applied by the blankers. The beams are subjected to blanking control by the deflection.

Electron beams deflected by the blankers of the blanking aperture array substrate 10 are blocked by the limited aperture member 14. On the other hand, electron beams not deflected by the blankers of the blanking aperture array substrate 10 pass through the holes of the limited aperture member 14. Beams that pass through the limited aperture member 14 from beam ON to beam OFF are beams for one shot.

The multiple beams 30a to 30e having passed through the limited aperture member 14 are focused by the objective lens 16 to be a pattern image having a desired reduction ratio. The beams (the entire multiple beams) having passed through the limited aperture member 14 are collectively deflected in the same direction by the deflector 18 and irradiated on the substrate 24.

The multiple beams irradiated at a time are ideally arranged at a pitch obtained by multiplying the array pitch of the plurality of holes of the molded aperture array substrate 8 by the desired reduction ratio explained above. The drawing apparatus performs a drawing operation in a raster scan scheme for continuously irradiating shot beams in order. When the drawing apparatus draws a desired pattern, necessary beams are controlled to beam ON by the blanking control according to the pattern. When the stage 22 is continuously moving, an irradiation position of the beams is controlled by the deflector 18 to follow the movement of the stage 22.

The controller C includes a control computer 50, a storage device 52, a calculator 53, a coil control circuit 54, a lens control circuit 55, a drawing control circuit 56, and a signal acquisition circuit 58. Functions of the control computer 50 may be configured by hardware or may be configured by software. When the functions are configured by the software, a program for realizing at least a part of the functions of the control computer 50 may be stored in a recording medium such as a CD-ROM and read and executed by a computer. The recording medium is not limited to a detachable recording medium such as a magnetic disk or an optical disk and may be a fixed recording medium such as a hard disk device or a memory.

For example, the control computer 50 acquires drawing data from the storage device 52, performs a plurality of stages of data conversion processing on the drawing data to generate shot data specific to the device, and outputs the shot data to the drawing control circuit 56. Irradiation amounts, irradiation position coordinates, and the like of shots are defined in the shot data.

The drawing control circuit 56 controls the sections of the drawing unit W and performs drawing processing. For example, the drawing control circuit 56 divides the irradiation amounts of the shots by current density to calculate an irradiation time t and, when a corresponding shot is performed, applies a deflection voltage to a corresponding blanker of the blanking aperture array substrate 10 to set beam ON only for irradiation time t.

The drawing control circuit 56 calculates a deflection amount such that the beams are deflected to positions (coordinates) indicated by the shot data and applies a deflection voltage to the deflector 18. Consequently, multiple beams shot in that time are collectively deflected.

The alignment mechanism 40 adjusts, with the alignment coil 44, the electron beam 30 to be made perpendicularly incident on the aperture 48a. If adjustment of an incident angle of the electron beam 30 on the aperture 48a is insufficient, a desired hole of the molded aperture array substrate 8 cannot be illuminated by the electron beam 30. A defect sometimes occurs in multiple beams (a beam array) irradiated on the substrate 24.

Therefore, in this embodiment, an adjuster 51 of the control computer 50 periodically performs focus adjustment for the electron beam 30. An adjustment method for the electron beam 30 according to this embodiment is explained.

Figure 2:
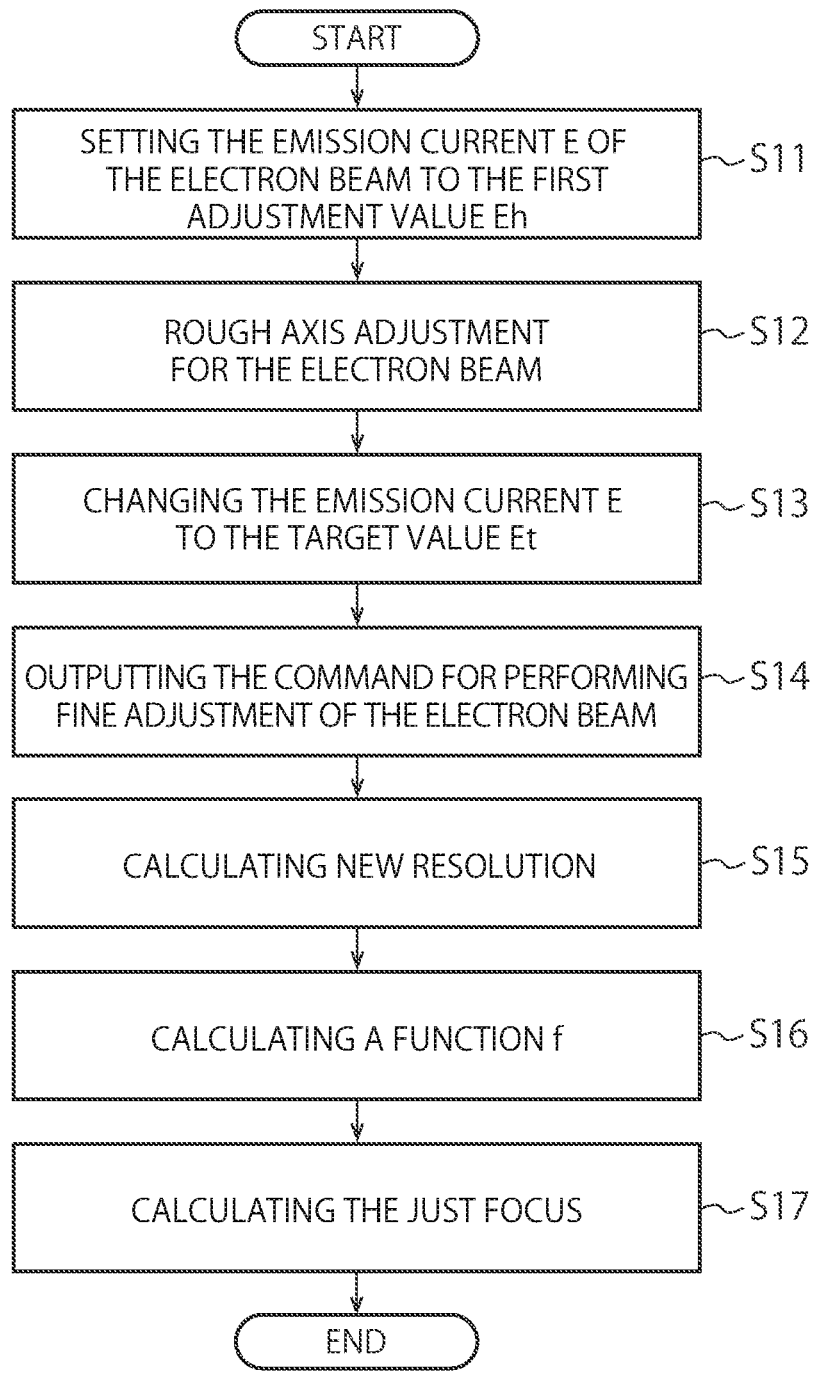
FIG. 2 is a flowchart showing a procedure of an adjustment method for an electron beam according to the first embodiment.

FIG. 2 is a flowchart showing a procedure of the adjustment method for the electron beam 30 according to the first embodiment.

First, the adjuster 51 instructs, to the high-voltage power supply 60, a command for setting an emission current E of the electron beam 30 emitted from the electron gun 4 to a first adjustment value Eh (step S11). The high-voltage power supply 60 supplies, based on the command from the adjuster 51, an electric current corresponding to the first adjustment value Eh to the electron gun 4. The first adjustment value Eh can be set to, for example, 40% to 60% of a target value Et during drawing.

Subsequently, the adjuster 51 outputs a command for performing rough axis adjustment for the electron beam 30 to the coil control circuit 54 (step S12). The coil control circuit 54 roughly adjusts, based on the command from the adjuster 51, a current value of the alignment coil 44 in which the electron beam emitted from the electron gun 4 passes through the aperture 48a and reaches the stage 22. In the rough axis adjustment, the electron beam 30 only has to reach the stage 22. At this time, the adjuster 51 varies a current value (hereinafter referred to as lens value) supplied to the electron lenses 6a and 6b, measures resolution, and roughly adjusts the focus. At this time, the calculator 53 calculates a range (a region R) obtained by adding a predetermined margin to a lens value at which resolution is considered to be minimized during actual drawing.

For example, first, the calculator 53 calculates, based on a relation between an electron beam diameter in the position of the aperture substrate 48 calculated by a simulation and the temperature of the aperture substrate 48, a range of an electron beam diameter at which the aperture substrate 48 has temperature equal to or lower than a predetermined temperature, for example, equal to or lower than a melting point of the aperture substrate 48. On the other hand, the calculator 53 varies the lens value, acquires an electron beam image (a scan image) on the aperture substrate 48, and calculates an electron beam diameter from the scan image. The calculator 53 calculates the region R based on a relation between the lens value and the electron beam diameter from the range of the electron beam at which the aperture substrate 48 has the temperature equal to or lower than the predetermined temperature.

Subsequently, the adjuster 51 instructs, to the high-voltage power supply 60, a command for changing the emission current E of the electron beam 30 from the first adjustment value Eh to the target value Et (a second adjustment value) (step S13). The high-voltage power supply 60 supplies an electric current corresponding to the target value Et to the electron gun 4 based on the command from the adjuster 51.

Subsequently, the adjuster 51 outputs a command for performing fine adjustment of the electron beam 30 to the lens control circuit 55 (step S14). The lens control circuit 55 performs, based on the command from the adjuster 51, fine adjustment for adjusting a lens value of the electron lenses 6a and 6b.

Figure 3:
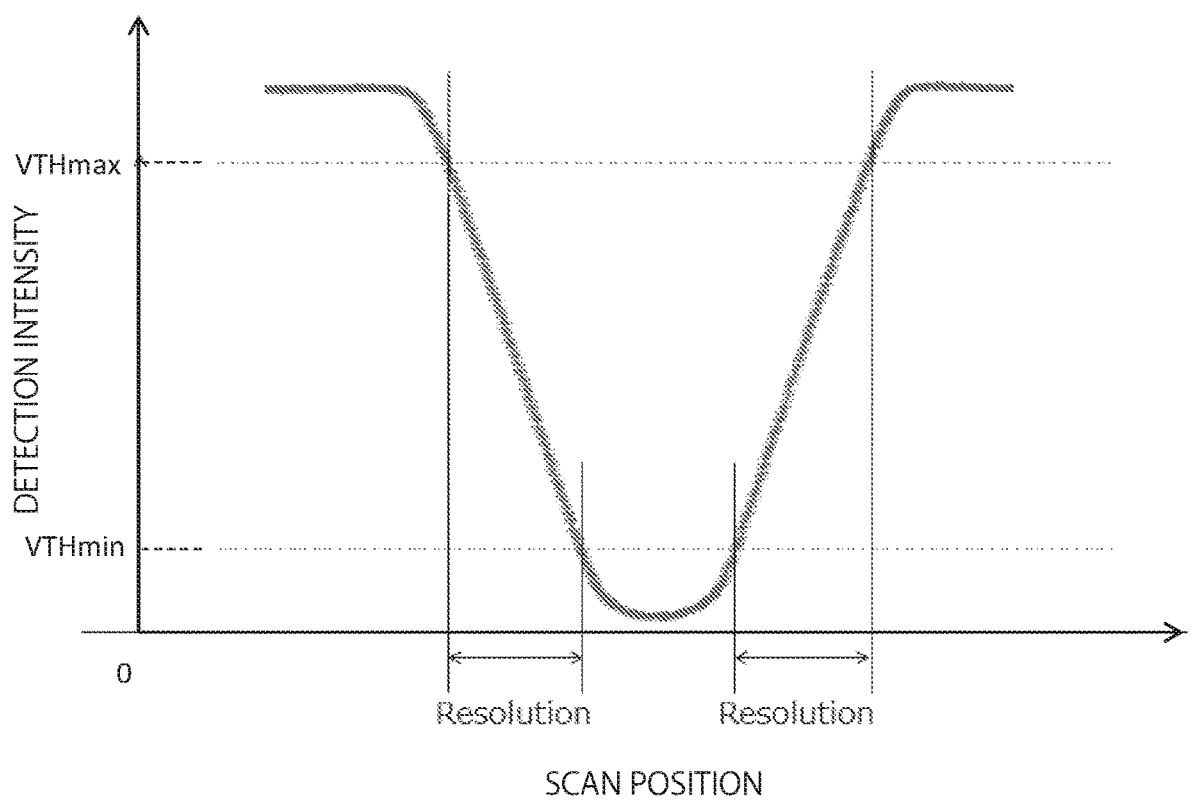
FIG. 3 is a graph showing a line profile of an electron at the time when an aperture is scanned in one direction by the electron beam.

FIG. 3 is a graph showing a line profile of electrons at the time when the aperture substrate 48 is scanned in one direction by the electron beam 30. In FIG. 3, the horizontal axis indicates a scan position of the aperture substrate 48 by the electron beam 30. On the other hand, the vertical axis indicates intensity of electrons detected by a detector provided on the aperture substrate 48.

In the line profile shown in FIG. 3, the detection intensity of the electrons decreases as the electron beam 30 approaches the aperture 48a. When the detection intensity of the electrons is acquired via the signal acquisition circuit 58, the adjuster 51 calculates resolution of the acquired detection intensity of the electron. The adjuster 51 calculates, as the resolution, for example, width between two perpendiculars at the time when perpendiculars are drawn from points where a cutoff upper limit value VTHmax and a cutoff lower limit value VTHmin set in advance cross the profile.

After the calculation of the resolution, the adjuster 51 outputs a command for changing the lens value of the electron lenses 6a and 6b to the lens control circuit 55. When the lens value is changed by the lens control circuit 55, the adjuster 51 scans the aperture 48a in one direction with the electron beam 30 again and calculates resolution.

Figure 4:
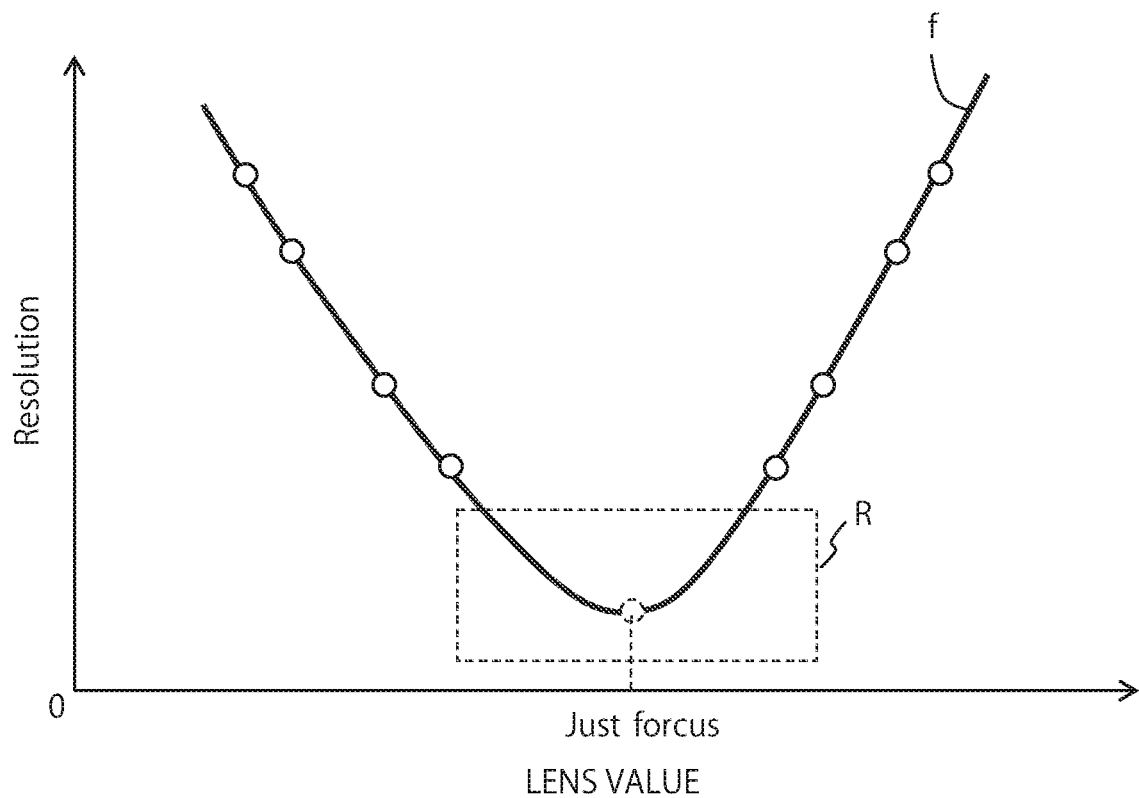
FIG. 4 is a graph showing a relation between a lens value and resolution.

FIG. 4 is a graph showing a relation between the lens value and the resolution. In FIG. 4, the horizontal axis indicates the lens value and the vertical axis indicates the resolution. As shown in FIG. 4, the adjuster 51 calculates, avoiding the region R including a lens value at which resolution at a just focus is minimized, resolution anew about each of a plurality of lens values around the region R (step S15). In other words, the adjuster 51 calculates resolution while changing the lens value until the resolution decreases to a preset value.

Thereafter, the adjuster 51 performs, for example, function fitting and calculates a function f indicating the relation between the lens value and the resolution with an approximate expression (step S16). Accordingly, in order to perform the function fitting with higher accuracy, it is preferable to measure the resolution at a larger number of lens values. Subsequently, the adjuster 51 calculates a just focus, which is a lens value at which the resolution is minimized, based on the function f (step S17). Note that the function f shown in FIG. 4 is a quadratic function. However, a degree is not limited. The function f may be a linear function.

When the lens value at the just focus of the electron lenses 6a and 6b is calculated, the focus adjustment for the electron beam 30 is completed. Thereafter, the drawing control circuit 56 executes drawing processing on the substrate 24 using the electron beam 30 emitted at the target value Et.

In this embodiment explained above, when the electron beam 30 is adjusted to the just focus of the electron lenses 6a and 6b, a gradient of the line profile shown in FIG. 3 becomes steep. Accordingly, if the scan on the aperture substrate 48 is repeated by the electron beam 30 adjusted to the just focus, large damage is applied to the aperture substrate 48.

Therefore, in this embodiment, when the rough axis adjustment of the electron beam 30 (step S12) is performed, rough focus adjustment of the electron beam 30 is performed. Thereafter, scan of the aperture substrate 48 is performed only in a peripheral region avoiding the vicinity of the just focus. The just focus is calculated by the function fitting based on a result of the scan. Consequently, the just focus can be calculated using an emission current of actual drawing, which is a target value, and scan under a condition in which large damage to the aperture substrate 48 is assumed is avoided. Therefore, it is possible to reduce damage to the aperture substrate 48 that occurs during the adjustment of the electron beam 30.

Second Embodiment

A second embodiment of the present invention is explained. In this embodiment, an apparatus configuration is the same as the apparatus configuration of the charged particle beam irradiation apparatus 1 according to the first embodiment explained above. Therefore, explanation about the apparatus configuration is omitted. A focus adjustment method for the electron beam 30 according to this embodiment is explained below with reference to FIG. 5.

Figure 5:
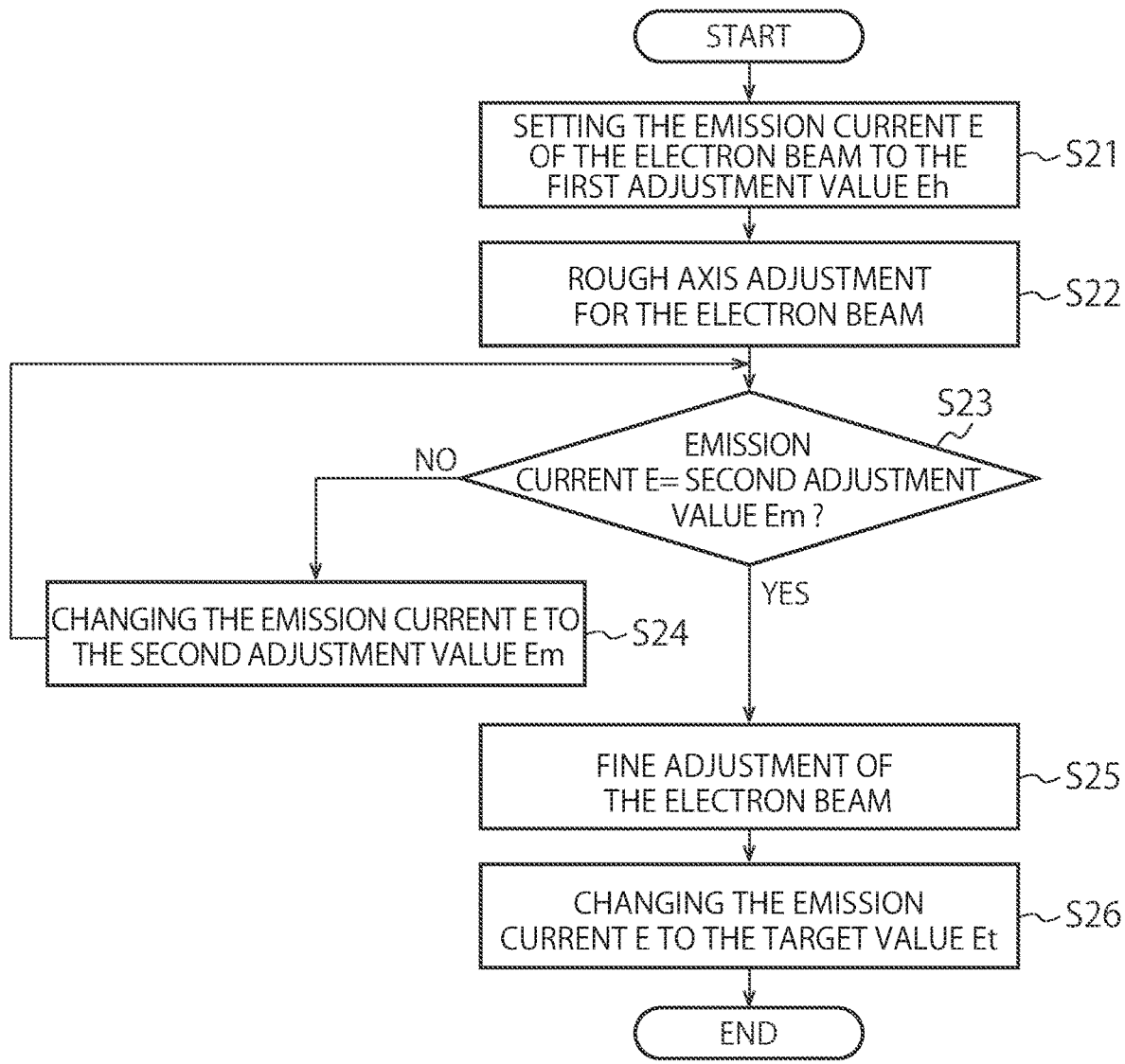
FIG. 5 is a flowchart showing a procedure of an adjustment method for an electron beam according to a second embodiment.

FIG. 5 is a flowchart showing a procedure of an adjustment method for the electron beam 30 according to the second embodiment.

First, as in the first embodiment, the adjuster 51 instructs, to the high-voltage power supply 60, a command for setting the emission current E of the electron beam 30 emitted from the electron gun 4 to the first adjustment value Eh (step S21). Subsequently, as in the first embodiment, the adjuster 51 outputs, to the coil control circuit 54, a command for performing rough axis adjustment of the electron beam 30 (step S22).

Subsequently, in the first embodiment explained above, the emission current E of the electron beam 30 is increased from the first adjustment value Eh to the target value Et and the fine adjustment is performed. In the fine adjustment, the aperture substrate 48 is scanned by the electron beam 30 avoiding the vicinity of a condition for the just focus of the electron lenses 6a and 6b. However, simply by avoiding the vicinity of the condition for the just focus, damage to the aperture substrate 48 sometimes cannot be fully avoided.

Therefore, in this embodiment, the fine adjustment is performed with a second adjustment value Em larger than the first adjustment value Eh and smaller than the target value Et. At this time, it is possible to implement a program for automatically detecting that the emission current E is high and reduces the emission current E to the second adjustment value Em and, then, starts scan on the aperture substrate 48. Specifically, the adjuster 51 sends a command for inquiring about a present emission current E to the high-voltage power supply 60. The adjuster 51 determines, based on a response from the high-voltage power supply 60, whether the emission current E is the second adjustment value Em (step S23). According to a result of the determination, the adjuster 51 outputs a command for changing the emission current E to the second adjustment value Em to the high-voltage power supply 60 (step S24). At this time, the second adjustment value Em is, for example, 80% to 95% of the target value Et.

When the emission current E is changed to the second adjustment value Em, the adjuster 51 outputs a command for performing fine adjustment of the electron beam 30 to the lens control circuit 55 (step S25). During the fine adjustment, as in the first embodiment, the adjuster 51 scans the aperture substrate 48 with the electron beam 30 avoiding a condition for the just focus of the electron lenses 6a and 6b and calculates the just focus with function fitting based on a result of the scan.

When the fine adjustment of the electron beam 30 ends, the adjuster 51 instructs, to the high-voltage power supply 60, a command for changing the emission current E of the electron beam 30 from the second adjustment value Em to the target value Et (step S26). Consequently, focus adjustment for the electron beam 30 is completed. Thereafter, the drawing control circuit 56 executes drawing processing on the substrate 24 using the electron beam 30 emitted at the target value Et.

According to this embodiment explained above, in the fine adjustment, the aperture substrate 48 is scanned by the electron beam 30 emitted at the second adjustment value Em smaller than the target value Et. Therefore, it is possible to further reduce the damage to the aperture substrate 48.

Third Embodiment

A third embodiment of the present invention is explained. In this embodiment, an apparatus configuration is the same as the apparatus configuration of the charged particle beam irradiation apparatus 1 according to the first embodiment explained above. Therefore, detailed explanation about the apparatus configuration is omitted. An adjustment method for the electron beam 30 according to this embodiment is explained below.

In this embodiment, as in the first embodiment, the emission current E of the electron beam 30 is set to the first adjustment value Eh (step S11) and the rough axis adjustment is performed (step S12).

Subsequently, as in the first embodiment, the emission current E is increased to the target value Et (step S13) and the fine adjustment is performed. In this embodiment, content of the fine adjustment is different from the content of the fine adjustment in the first embodiment.

Figure 6:
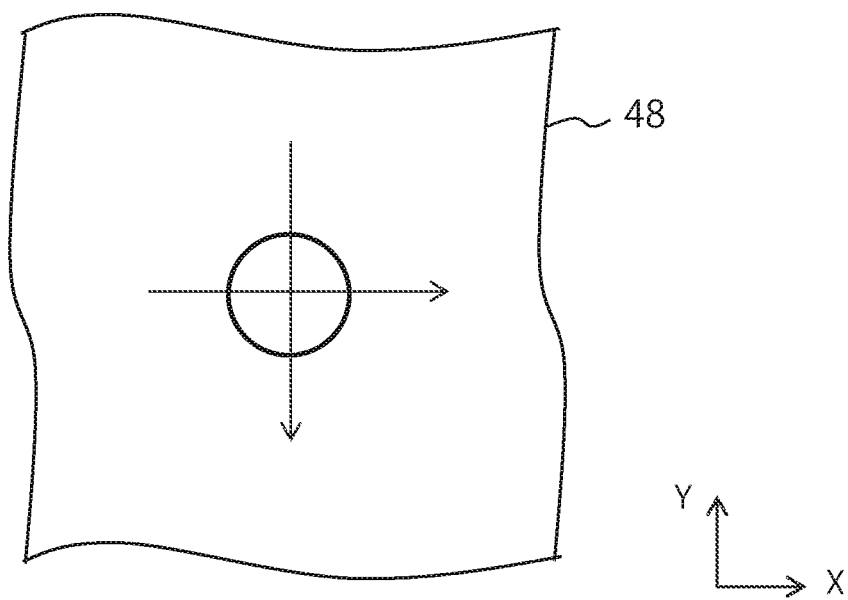
FIG. 6 is a plan view showing a fine adjustment process according to a third embodiment.

FIG. 6 is a plan view showing a fine adjustment process according to the third embodiment. In this embodiment, as shown in FIG. 6, the adjuster 51 scans, on the aperture substrate 48, the electron beam 30 in an X direction and a Y direction orthogonal to each other.

Specifically, about each of the X direction and the Y direction, every time the lens value of the electron lenses 6a and 6b is changed, the adjuster 51 acquires a line profile of electrons detected by a detector of the aperture substrate 48. Subsequently, the adjuster 51 calculates resolution based on line profiles. At this time, as in the first embodiment, the adjuster 51 calculates resolution about each of a plurality of lens values avoiding a condition of a lens value at which the resolution is minimized. Finally, the adjuster 51 calculates a just focus by performing function fitting of a calculated plurality of kinds of resolution.

Figure 7:
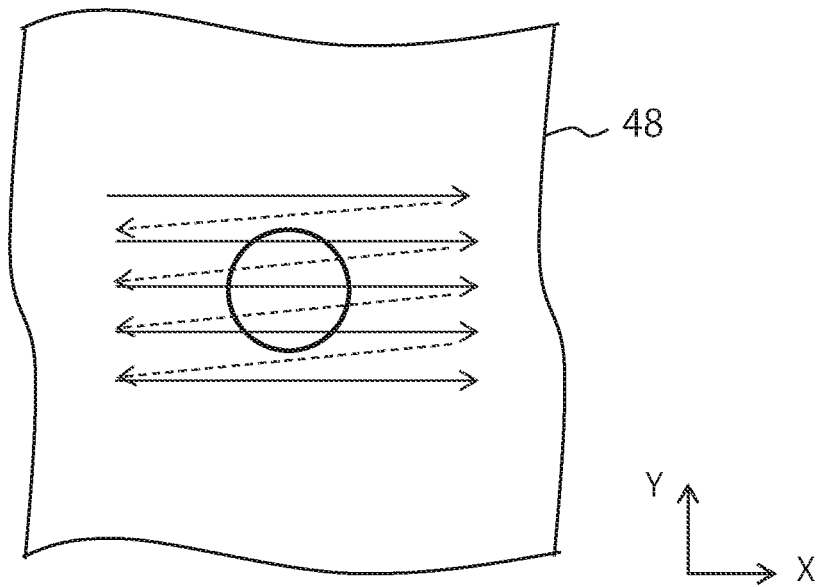
FIG. 7 is a plan view showing a general 2D scan method for an aperture by an electron beam.

FIG. 7 is a plan view showing a general 2D scan method for the aperture substrate 48 by the electron beam 30. In the 2D scan method shown in FIG. 7, the electron beam 30 is scanned in the X direction in a plurality of places around the aperture substrate 48. With the 2D scan method, the electron beam 30 is scanned in the same direction many times with respect to one lens value to acquire a line profile of electrons detected by the aperture substrate 48.

On the other hand, in this embodiment, the line profile is acquired by 1D scan for performing scanning once in each of different two directions, for example, the X direction and the Y direction with respect to one lens value. Therefore, according to this embodiment, since the number of times of scan is reduced, it is possible to further reduce the damage to the aperture substrate 48. Further, since a scan time is also reduced, a time required for the fine adjustment can be reduced. As a result, it is possible to end the adjustment of the electron beam 30 in a short time.

(Modification)

Figure 8:
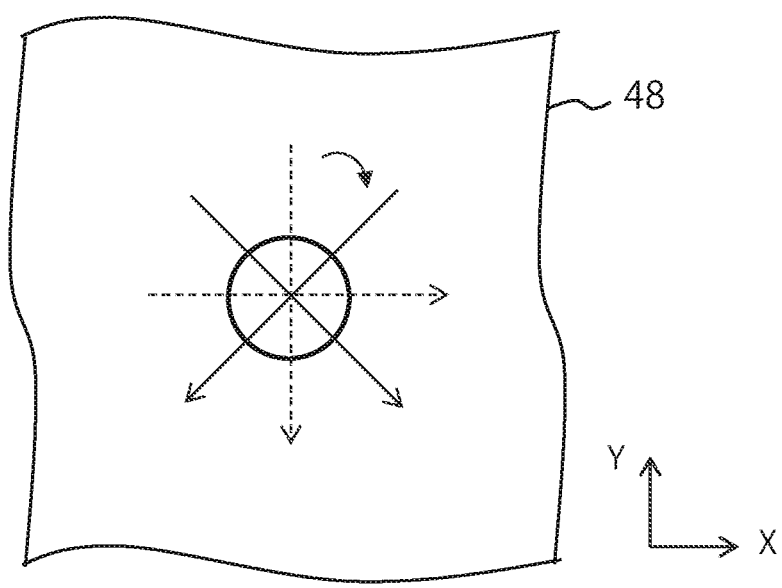
FIG. 8 is a plan view showing a fine adjustment process according to a modification of the third embodiment.

FIG. 8 is a plan view showing a fine adjustment process according to a modification of the third embodiment. In the third embodiment explained above, when the scan is performed in the same two directions every time focus adjustment is performed, damage is accumulated only in a scan portion of the aperture substrate 48.

Therefore, in this modification, the adjuster 51 rotates a scan direction and changes a phase of the scan direction as shown in FIG. 8 every time the adjustment is performed or, when the number of times of the focus adjustment of the electron beam 30 is counted, every time the number of times of adjustment reaches a predetermined number. Consequently, since the scan portion of the aperture substrate 48 periodically changes, the accumulation of the damage is dispersed. Accordingly, the life of the aperture substrate 48 is extended and the aperture substrate 48 can be used for a long period.

Note that, in the embodiments and the modification explained above, the focus adjustment method for the electron beam 30 is explained. However, the present invention may be applied to centering adjustment for causing the electron beam 30 to pass through the center of the aperture 48a. In the centering adjustment, it is possible to reduce damage to the aperture substrate 48 by scanning the aperture substrate 48 avoiding the condition for the lens value at the just focus of the electron lenses 6a and 6b.

In order to further reduce the damage to the aperture substrate 48, the emission current E of the electron beam 30 may be reduced to the second adjustment value Em explained in the second embodiment to scan the aperture substrate 48.

At this time, in order to reduce a scan time, the 1D scan (see FIG. 8) explained in the third embodiment may be performed. However, when the position of the aperture 48a greatly deviates, it is likely that the center position of the aperture 48a cannot be grasped by the 1D scan. Accordingly, it is desirable to combine the 2D scan shown in FIG. 7 and the 1D scan shown in FIG. 8. For example, in a procedure for roughly performing the 2D scan in order to grasp the position of the aperture 48a, adjusting the position of the aperture 48a, and finally confirming the centering adjustment in the 1D scan, it is possible to reduce the scan time compared with when the 2D scan is performed twice.

Note that, in these embodiments, focus adjustment of a crossover position in an aperture array on the upstream side of the molded aperture array substrate 8 is performed. However, the present embodiment is also applicable at focus adjustment time in a crossover position in the limited aperture member 14 or the like on the downstream side.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A charged particle beam adjustment method comprising:
    scanning, with a charged particle beam an emission current of which is set to a first adjustment value smaller than a target value used for drawing, an aperture substrate including a hole disposed to be a position of a focus of the charged particle beam using each of a plurality of lens values in an electron lens provided on an upstream side of the aperture substrate and calculating first resolution at each of the plurality of lens values;
    calculating a first function of the plurality of lens value and the first resolution and calculating, from the first function, a lens value range obtained by adding a predetermined margin to a lens value at a just focus where resolution is minimized during actual drawing of the charged particle beam;
    scanning, with the charged particle beam the emission current of which is set to a second adjustment value larger than the first adjustment value and equal to or smaller than the target value, the aperture substrate using each of a plurality of lens values set to avoid the lens value range and calculating second resolution at each of the plurality of lens values;
    calculating a second function of the plurality of lens values and the second resolution and estimating a lens value at the just focus from the second function; and
    adjusting the electron lens to the estimated lens value at the just focus.

2. The method of claim 1, wherein, in the scan, 1D scan is performed in different two directions at the plurality of lens values.

3. The method of claim 1, wherein the predetermined margin is calculated based on a relation between a beam diameter calculated in advance and temperature of the aperture substrate and a relation between a beam diameter on the aperture substrate calculated from a scan image acquired by varying the lens value and irradiating the charged particle beam and the lens value.

4. A charged particle beam drawing method for drawing on an irradiation target object with the charged particle beam the emission current of which is set to the target value, using the lens value adjusted by the charged particle beam adjustment method according to claim 1.

5. A charged particle beam irradiation apparatus comprising:
    an emitter configured to emit a charged particle beam with a predetermined emission current;
    an electron lens provided on a downstream side of the emitter and configured to adjust a focus of the charged particle beam with a lens value;
    an aperture substrate disposed on the downstream side of the electron lens and including a hole disposed to be a focus position of the charged particle beam;
    a calculator configured to calculate a first function of a first resolution obtained by scanning the aperture substrate using a plurality of the lens values with the charged particle beam emitted at a first adjustment value, which is the emission current smaller than a target value used for drawing, and the plurality of lens values, calculate, from the first function, a lens value range obtained by adding a predetermined margin to a lens value at a just focus where resolution is minimized during actual drawing of the charged particle beam in the electron lens, calculate a second function of second resolution obtained by scanning, with a charged particle beam emitted at a second adjustment value, which is the emission current larger than the first adjustment value and equal to or smaller than the target value, the aperture substrate using the plurality of lens values avoiding the lens value range and the plurality of lens values, and estimate a lens value at the just focus from the second function; and
    an adjuster configured to adjust the electron lens to the estimated lens value at the just focus.

6. The charged particle beam irradiation apparatus according to claim 5, wherein, in the scan, 1D scan is performed in different two directions at the plurality of lens values.

7. The charged particle beam irradiation apparatus according to claim 5, wherein the predetermined margin is calculated based on a relation between a beam diameter calculated in advance and temperature of the aperture substrate and a relation between a beam diameter on the aperture substrate calculated from a scan image acquired by varying the lens value and irradiating the charged particle beam and the lens value.

* * * * *